United States Patent
Sun et al.

(10) Patent No.: US 10,038,003 B2
(45) Date of Patent: Jul. 31, 2018

(54) SINGLE-POLY NONVOLATILE MEMORY CELL STRUCTURE HAVING AN ERASE DEVICE

(71) Applicant: eMemory Technology Inc., Hsin-Chu (TW)

(72) Inventors: Wein-Town Sun, Taoyuan (TW); Wei-Ren Chen, Pingtung County (TW); Ying-Je Chen, Taichung (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/384,323

(22) Filed: Dec. 20, 2016

(65) Prior Publication Data
US 2017/0207230 A1    Jul. 20, 2017

Related U.S. Application Data

(60) Provisional application No. 62/280,683, filed on Jan. 19, 2016.

(51) Int. Cl.
| | |
|---|---|
| *H01L 27/115* | (2017.01) |
| *H01L 27/11558* | (2017.01) |
| *H01L 27/12* | (2006.01) |
| *H01L 29/06* | (2006.01) |
| *H01L 27/11524* | (2017.01) |
| *H01L 29/08* | (2006.01) |

(Continued)

(52) U.S. Cl.
CPC .. *H01L 27/11558* (2013.01); *H01L 27/11524* (2013.01); *H01L 27/1203* (2013.01); *H01L 29/0649* (2013.01); *H01L 29/0847* (2013.01); *H01L 29/1095* (2013.01); *H01L 29/42328* (2013.01)

(58) Field of Classification Search
CPC ......... H01L 27/11558; H01L 29/42328; H01L 27/11524; H01L 27/1203
See application file for complete search history.

(56) References Cited

U.S. PATENT DOCUMENTS

| | | | |
|---|---|---|---|
| 6,696,723 B2 * | 2/2004 | Hartmann | H01L 21/84 257/314 |
| 9,520,404 B2 | 12/2016 | Horch | |

(Continued)

FOREIGN PATENT DOCUMENTS

| | | |
|---|---|---|
| JP | 2006186403 A | 7/2006 |
| JP | 2007149997 A | 6/2007 |

(Continued)

*Primary Examiner* — David Vu
(74) *Attorney, Agent, or Firm* — Winston Hsu (57) ABSTRACT

A single-poly nonvolatile memory cell includes an SOI substrate having a semiconductor layer, a first OD region and a second OD region on the semiconductor layer, an isolation region separating the first OD region from the second OD region, a PMOS select transistor disposed on the first OD region, and a PMOS floating gate transistor disposed on the first OD region. The PMOS floating gate transistor is serially connected to the PMOS select transistor. The PMOS floating gate transistor comprises a floating gate overlying the first OD region. A floating gate extension is continuously extended from the floating gate to the second OD region and is capacitively coupled to the second OD region.

13 Claims, 11 Drawing Sheets

(51) Int. Cl.
*H01L 29/10* (2006.01)
*H01L 29/423* (2006.01)

(56) References Cited

U.S. PATENT DOCUMENTS

| | | | |
|---|---|---|---|
| 2006/0018161 A1* | 1/2006 | Chen | G11C 16/0441 |
| | | | 365/185.28 |
| 2006/0208306 A1 | 9/2006 | Peng | |
| 2007/0120175 A1 | 5/2007 | Tanaka | |
| 2007/0296034 A1 | 12/2007 | Chen | |
| 2009/0114971 A1* | 5/2009 | Cai | G11C 16/0433 |
| | | | 257/315 |
| 2009/0225601 A1 | 9/2009 | Shih | |
| 2009/0267127 A1 | 10/2009 | Chen | |
| 2010/0157669 A1 | 6/2010 | Audzeyeu | |
| 2013/0234229 A1* | 9/2013 | Huang | H01L 29/7883 |
| | | | 257/321 |

FOREIGN PATENT DOCUMENTS

| | | |
|---|---|---|
| JP | 200949182 A | 3/2009 |
| JP | 2014-116547 A | 6/2014 |
| JP | 2015128083 A | 7/2015 |
| JP | 2016-9692 A | 1/2016 |
| JP | 2016-143856 A | 8/2016 |
| JP | 2016532292 A | 10/2016 |

* cited by examiner

| | $V_{SL}$ | $V_{SG}$ | $V_{NW}$ | $V_{BL}$ | $V_{CG}$ |
|---|---|---|---|---|---|
| PGM(CHE) | $V_{PP}$ | $0 \sim \frac{1}{2}V_{PP}$ | $V_{PP}$ | 0 | $0 \sim V_{PP}$ |
| PGM-inhibit | $V_{PP}$ | $0 \sim \frac{1}{2}V_{PP}$ | $V_{PP}$ | floating | $0 \sim V_{PP}$ |
| PGM-unselect | $V_{PP}$ | $V_{PP}$ | $V_{PP}$ | 0/floating | $0 \sim V_{PP}$ |
| ERS (FN) | 0 | 0 | 0 | 0 | $V_{EE}$ |
| ERS (FN) Back up | $V_{BB}$ | $V_{BB}$ | $V_{BB}$ | $V_{BB}$ | $V_{EE}$ |
| READ | $V_{READ}$ | $V_{READ}$ | $V_{READ}$ | 0.4 | 0 |
| READ-unselect | $V_{READ}$ | $V_{READ}$ | $V_{READ}$ | 0.4/floating | 0 |

| | $V_{SL}$ | $V_{SG}$ | $V_{NW}$ | $V_{BL}$ | $V_{CG}$ |
|---|---|---|---|---|---|
| PGM(CHE) | $V_{PP}$ | $0\sim\frac{1}{2}V_{PP}$ | $V_{PP}$ | 0 | $0\sim\frac{1}{2}V_{PP}$ |
| PGM-inhibit | $V_{PP}$ | $0\sim\frac{1}{2}V_{PP}$ | $V_{PP}$ | floating | $\frac{1}{4}\sim\frac{1}{2}V_{PP}$ |
| PGM-unselect | $V_{PP}$ | $V_{PP}$ | $V_{PP}$ | 0/floating | $0\sim\frac{1}{2}V_{PP}$ |
| ERS (FN) | $V_{EE}$ | $V_{EE}/V_{EE}-\Delta V$ | $V_{EE}$ | $V_{EE}$ | 0 |
| ERS (FN) Back up | $V_{EE}$ | $V_{EE}/V_{EE}-\Delta V$ | $V_{EE}$ | $V_{EE}$ | $0\sim V_{BB}$ |
| READ | $V_{READ}$ | 0 | $V_{READ}$ | 0.4 | 0 |
| READ-unselect | $V_{READ}$ | $V_{READ}$ | $V_{READ}$ | 0.4/floating | 0 |

FIG. 13

SINGLE-POLY NONVOLATILE MEMORY CELL STRUCTURE HAVING AN ERASE DEVICE

CROSS REFERENCE TO RELATED APPLICATIONS

This application claims the benefit of U.S. provisional application No. 62/280,683 filed Jan. 19, 2016.

BACKGROUND OF THE INVENTION

1. Field of the Invention

The present invention relates to a nonvolatile memory and, more particularly, to a single-poly nonvolatile memory cell structure having an erase device on a silicon-on-insulator (SOI) substrate.

2. Description of the Prior Art

Figure 1:
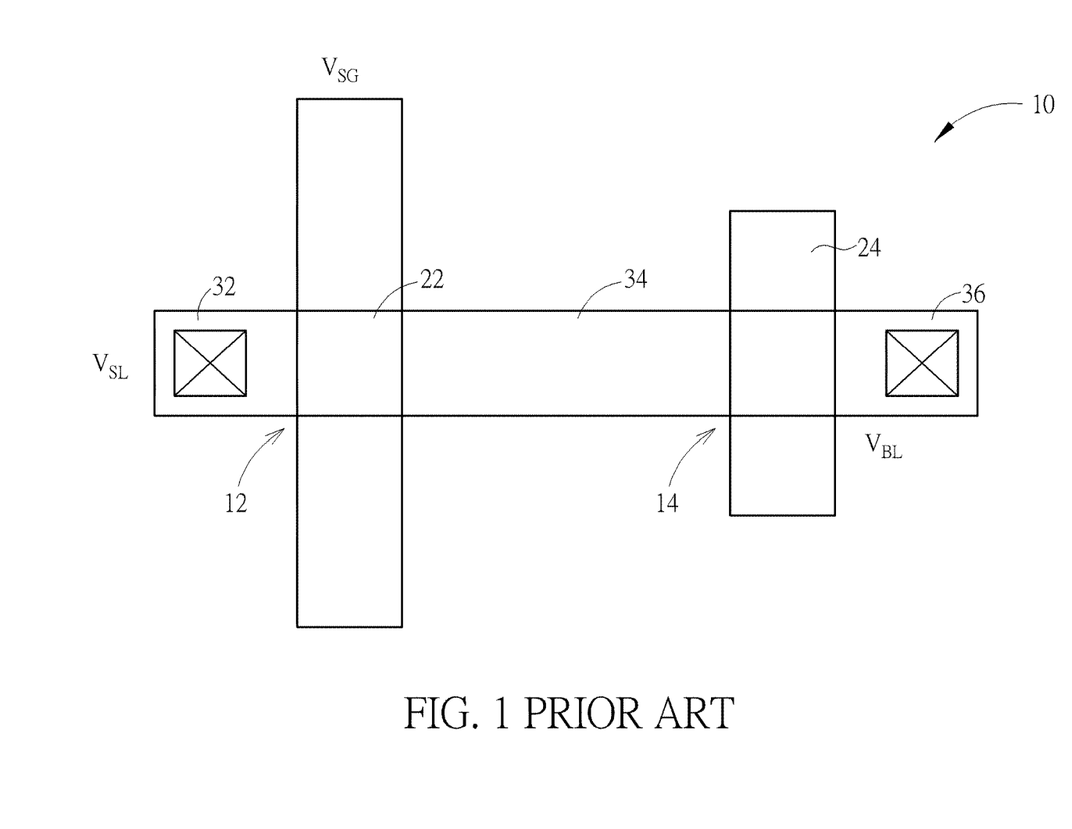
FIG. 1 is a schematic layout diagram showing a prior art single-poly non-volatile memory cell.

Single-poly non-volatile memory is known in the art. FIG. 1 is a schematic layout diagram of a single-poly non-volatile memory cell. As shown in FIG. 1, the single-poly non-volatile memory cell 10 comprises two serially connected PMOS transistors 12 and 14. The PMOS transistor 12 includes a select gate 22, a P$^+$ source doping region 32 and a P$^+$ drain/source doping region 34. The PMOS transistor 14 includes a floating gate 24, the P$^+$ drain/source doping region 34 and a P$^+$ drain doping region 36. The two serially connected PMOS transistors 12 and 14 share the P$^+$ drain/source doping region 34. The single-poly non-volatile memory cell 10 is fully compatible with CMOS logic processes.

In operation, the select gate 22 of the PMOS transistor 12 is coupled to a select gate voltage $V_{SG}$, the P$^+$ source doping region 32 of the PMOS transistor 12 is electrically coupled to a source line voltage $V_{SL}$ by way of a source line contact, the P$^+$ drain/source doping region 34 and the floating gate 24 are electrically floating, and the P$^+$ drain doping region 36 of the PMOS transistor 14 is electrically coupled to a bit line voltage $V_{BL}$ through a bit line contact. Under the program mode, electrons are selectively injected and stored in the floating gate 24. The memory structure is operated at low voltages.

Because the single-poly non-volatile memory is compatible with standard CMOS logic processes, it is usually applied in the field of embedded memory, embedded non-volatile memory in the mixed-mode circuits and microcontrollers (such as System on Chip, SOC).

There is a trend to make smaller and smaller NVM devices. As the NVM devices become smaller, it is anticipated that the cost per bit of a memory system will be reduced. However, the scalability of the prior art NVM cell is limited by the rule of implanting I/O ion wells that are implanted into the substrate to a junction depth that is deeper than the depth of the shallow trench isolation (STI) in the memory array region.

SUMMARY OF THE INVENTION

It is one object of the invention to provide an improved single-poly nonvolatile memory cell structure having an erase device formed in an SOI (silicon-on-insulator) substrate.

It is another objective of the invention to provide an improved single-poly, multi-time programmable (MTP) non-volatile memory cell that has reduced memory cell size.

According to one aspect of the invention, a single-poly nonvolatile memory cell includes a silicon-on-insulator (SOI) substrate comprising a silicon substrate, a buried oxide layer, and a semiconductor layer; a first oxide define (OD) region and a second oxide define (OD) region on the semiconductor layer; an isolation region in the semiconductor layer, the isolation region separating the first OD region from the second OD region; a PMOS select transistor disposed on the first OD region; a PMOS floating gate transistor disposed on the first OD region, the PMOS floating gate transistor being serially connected to the PMOS select transistor, wherein the PMOS floating gate transistor comprises a floating gate overlying the first OD region; and a floating gate extension continuously extended from the floating gate to the second OD region and being capacitively coupled to the second OD region.

The PMOS select transistor comprises a select gate, a select gate oxide layer between the select gate and the semiconductor layer, a P$^+$ source doping region, and a P$^+$ drain/source doping region, wherein the P$^+$ source doping region is electrically connected to a source line.

The PMOS floating gate transistor comprises a floating gate, a floating gate oxide layer between the floating gate and the semiconductor layer, a P$^+$ drain doping region and the P$^+$ drain/source doping region, wherein the P$^+$ drain/source doping region is shared by the PMOS select transistor and the PMOS floating gate transistor.

According to one embodiment, an ion well such as an N well or a P well may be disposed in the semiconductor layer. The ion well completely overlaps with the second OD region. A heavily doped region such as N$^+$ or P$^+$ doping region is disposed in the ion well within the second OD region. The second OD region, the heavily doped region, the floating gate oxide layer, and the floating gate extension that is capacitively coupled to the heavily doped region together constitute an erase device.

According to another embodiment, the single-poly non-volatile memory cell further comprises a charge collecting region that is contiguous with the first OD region, wherein the charge collecting region collects redundant electrons and holes accumulated in the semiconductor layer during operation of the single-poly nonvolatile memory cell. The charge collecting region comprises a third OD region, an N$^+$ doping region in the third OD region, abridge region connecting the N$^+$ doping region with the semiconductor layer directly under the floating gate.

According to still another embodiment, the single-poly nonvolatile memory cell further comprises an N$^+$ doping region that is contiguous with the P$^+$ doping region on the same side of the select gate, thereby forming a butted contact region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations or process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

The present invention pertains to a single-poly non-volatile memory having an erase device, which may function as a multi-time programmable memory (MTP). The single-poly non-volatile memory is fabricated on an SOI (silicon-on-insulator or semiconductor-on-insulator) substrate. The SOI substrate may comprises a silicon substrate, a buried oxide layer, and a silicon (or semiconductor) active layer on the buried oxide layer. The single-poly non-volatile memory device is fabricated in or on the silicon (or semiconductor) active layer. The SOI substrate may be any commercially available SOI products, which can be fabricated using conventional SIMOX method, but not limited thereto. The single-poly non-volatile memory device may be a fully depleted SOI device or partially depleted SOI device.

Figure 2:
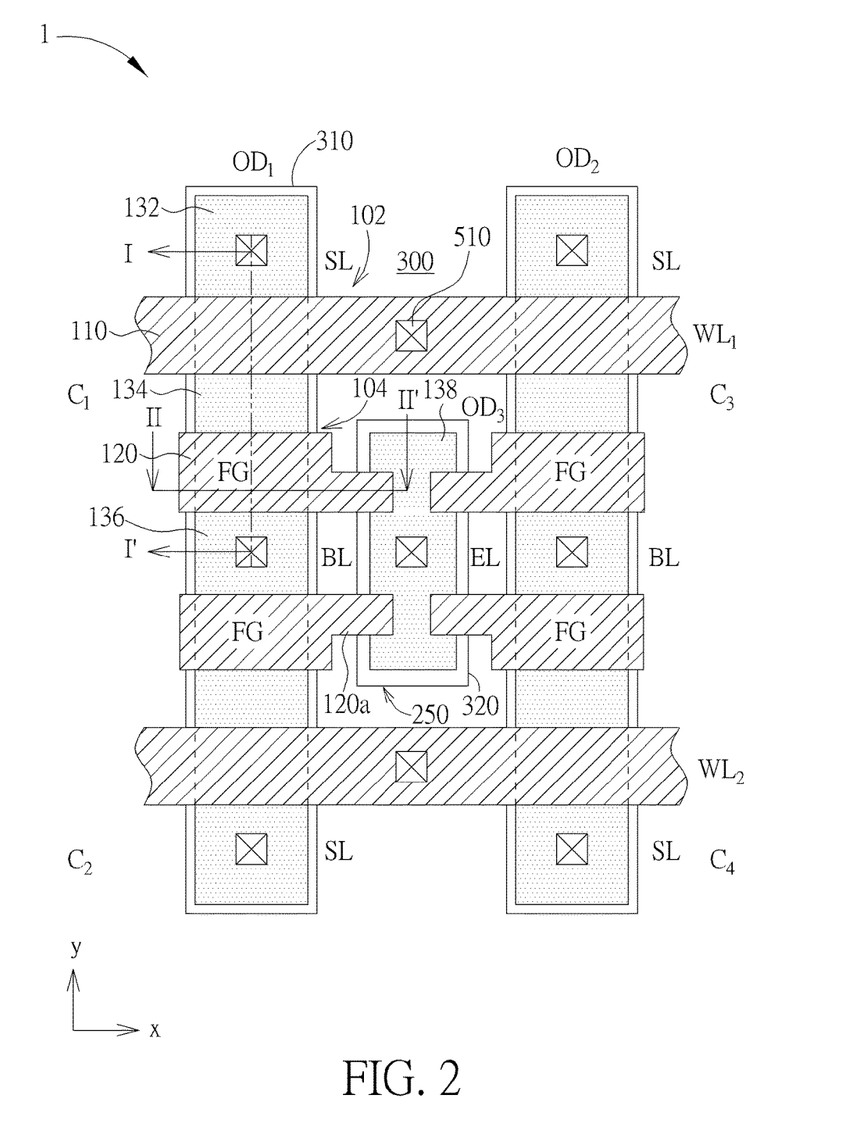
FIG. 2 is a schematic layout diagram showing a portion of a single-poly nonvolatile memory according to one embodiment of this invention.
Figure 3:
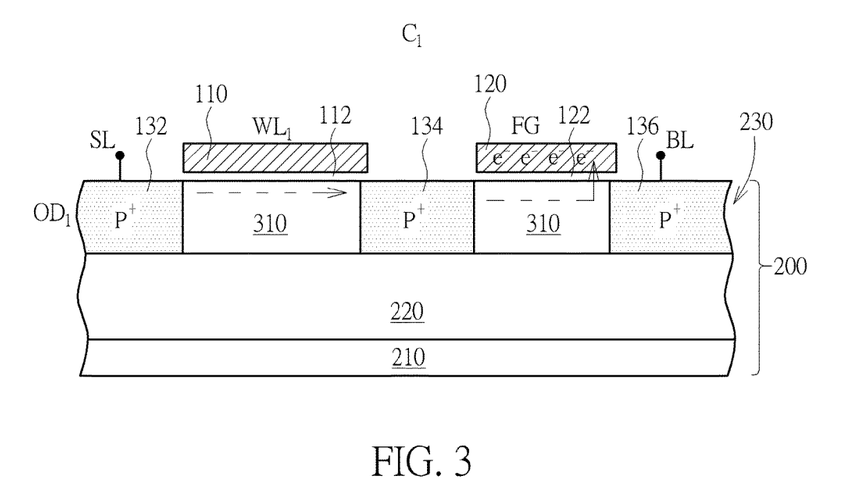
FIG. 3 is a cross-sectional view of a memory cell unit taken along line I-I' in FIG. 2.
Figure 4:
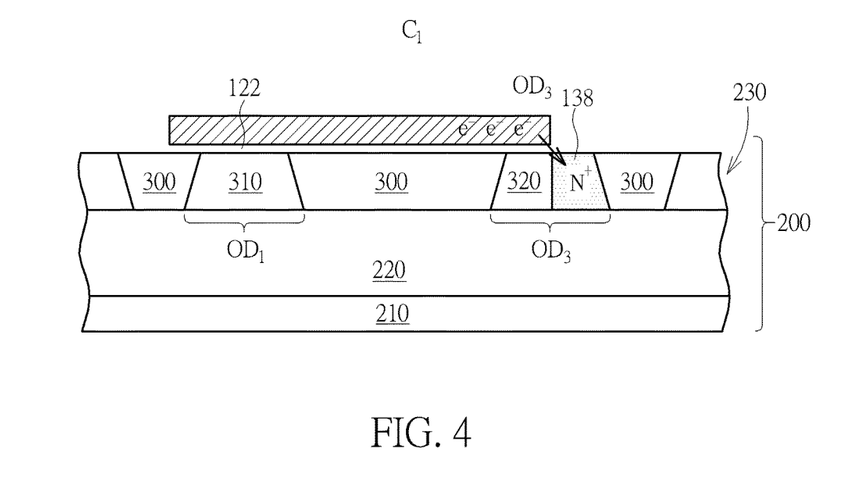
FIG. 4 is a cross-sectional view of a memory cell unit taken along line II-II' in FIG. 2.

FIG. 2 is a schematic layout diagram showing a portion of a single-poly nonvolatile memory according to one embodiment of this invention. FIG. 3 is a cross-sectional view taken along line I-I' in FIG. 2. FIG. 4 is a cross-sectional view taken along line II-II' in FIG. 2. As shown in FIG. 2, the single-poly nonvolatile memory 1 comprises a plurality of memory cells including, for example, four memory cell units $C_1$~$C_4$. It is understood that the layout of the memory cells in FIG. 2 is for illustration purposes only. In FIG. 2, for example, only three oxide define (OD) regions: $OD_1$, $OD_2$, and $OD_3$ are shown. According to the embodiment of the invention, the memory cells $C_1$ and $C_2$ are fabricated on the oxide define region $OD_1$ and the memory cells $C_3$ and $C_4$ are fabricated on the oxide define region $OD_2$.

According to the embodiment of the invention, the oxide define regions $OD_1$, $OD_2$, and $OD_3$ may be strip-shaped regions extending along a reference y-axis. The oxide define regions $OD_1$, $OD_2$, and $OD_3$ are isolated from one another by the shallow trench isolation (STI) region 300. Only two word lines $WL_1$ and $WL_2$ are shown in FIG. 2. The two word lines $WL_1$ and $WL_2$ intersect the oxide define regions $OD_1$, $OD_2$ and extend along a reference x-axis. An erase device 250 may be fabricated on the oxide define region $OD_3$. According to the embodiment of the invention, the erase device 250 may be shared by the four memory cell units $C_1$~$C_4$.

According to the embodiment of the invention, the oxide define region $OD_3$ is interposed between the oxide define region $OD_1$ and the oxide define region $OD_2$. The oxide define region $OD_3$ is spaced apart from the two word lines $WL_1$ and $WL_2$. The oxide define region $OD_3$ does not overlap with the two word lines $WL_1$ and $WL_2$ when viewed from the above.

According to the embodiment of the invention, the memory cell unit $C_1$ and the memory cell unit $C_2$ share the same $P^+$ drain/source doping region and the same bit line contact. According to the embodiment of the invention, the memory cell unit $C_3$ and the memory cell unit $C_4$ share the same $P^+$ drain doping region and the same bit line contact.

As shown in FIG. 2, FIG. 3 and FIG. 4, each of the four memory cell units (taking the memory cell unit C1 as an example) comprises a PMOS select transistor 102 and a PMOS floating gate transistor 104 that is serially connected to the PMOS select transistor 102. The PMOS select transistor 102 and the PMOS floating gate transistor 104 are formed together on the oxide define region $OD_1$ that is defined in the semiconductor layer 230 of an SOI substrate 200. The cell structure of the memory cell units $C_2$ is mirror-symmetric to the memory cell unit $C_1$. The cell structures of the memory cell units $C_3$ and $C_4$ are mirror-symmetric to the memory cell units $C_1$ and $C_2$, respectively.

The semiconductor layer 230 may be a single-crystalline silicon layer, but is not limited thereto. The SOI substrate 200 may further comprise a buried oxide layer 220 and a silicon substrate 210. The semiconductor layer 230 is electrically isolated from the silicon substrate 210 by the buried oxide layer 220. The STI region 300 is contiguous with the buried oxide layer 230. The silicon substrate 210 may be a P type silicon substrate, but is not limited thereto. In the semiconductor layer 230, an N well 310, which is completely overlapped with the oxide define region $OD_1$, maybe formed by using ion implantation methods. In some embodiments, the N well 310 may be omitted so that the channel maybe formed in the intrinsic silicon.

The PMOS select transistor 102 comprises a select gate 110, a select gate oxide layer 112 between the select gate 110 and the semiconductor layer 230, a $P^+$ source doping region 132, and a P+ drain/source doping region 134. The PMOS floating gate transistor 104 comprises a floating gate 120, a floating gate oxide layer 122 between the floating gate 120 and the semiconductor layer 230, the P+ drain/source doping region 134, and a P+ drain doping region 136. The PMOS select transistor 102 and the PMOS floating gate transistor 104 share the P+ drain/source doping region 134. For the sake of simplicity, spacers on the sidewalls of the select gate 110 and the floating gate 120 are not illustrated.

As can be seen in FIG. 2 and FIG. 4, the floating gate 120 includes an extended portion (or floating gate extension) 120a that extends along the reference x direction to overlap with the oxide define region $OD_3$. The extended portion 120a may have a width that is smaller than the width of the floating gate 120. According to the embodiment of the invention, the overlapping area between the extended portion 120a and the oxide define region $OD_3$ is smaller than the overlapping area between the floating gate 120 and the oxide define region $OD_1$.

In the oxide define region $OD_3$, a heavily doped region 138 is formed. The heavily doped region 138 may be an N+ doping region or a P+ doping region. An ion well 320 such as an N well or a P well may be formed in the semiconductor layer 230 and completely overlaps with the oxide define region $OD_3$. Alternatively, the heavily doped region 138 may be formed within the intrinsic silicon, and in such case, no ion well is formed in the oxide define region $OD_3$. It is to be understood that the shape of the floating gate is only for illustration purposes.

According to the embodiment of the invention, the oxide define region $OD_3$, the heavily doped region 138, the floating gate oxide layer 122, and the extended portion 120a that is capacitively coupled to the heavily doped region 138 and the oxide define region $OD_3$ together constitute the erase device 250.

In operation, the select gate 110 of the PMOS select transistor 102 is coupled to a select gate voltage $V_{SG}$ by way of a word line contact 510, the P+ source doping region 132 of the PMOS select transistor 102 is electrically coupled to a source line voltage $V_{SL}$ by way of a source line (SL) contact, the P+ drain/source doping region 134 and the floating gate 120 are electrically floating, and the P+ drain doping region 136 of the PMOS floating gate transistor 104 is electrically coupled to a bit line voltage $V_{BL}$ through a bit line (BL) contact. The heavily doped region 138 is electrically coupled to an erase line voltage $V_{EL}$ through an erase line (EL) contact.

Under the program mode, electrons are selectively injected into the floating gate 120 by channel hot electron (CHE) injection. Under the erase mode (sector or chip erase), electrons may be erased from the floating gate 120 by Fowler-Nordheim (FN) tunneling.

Figure 5:
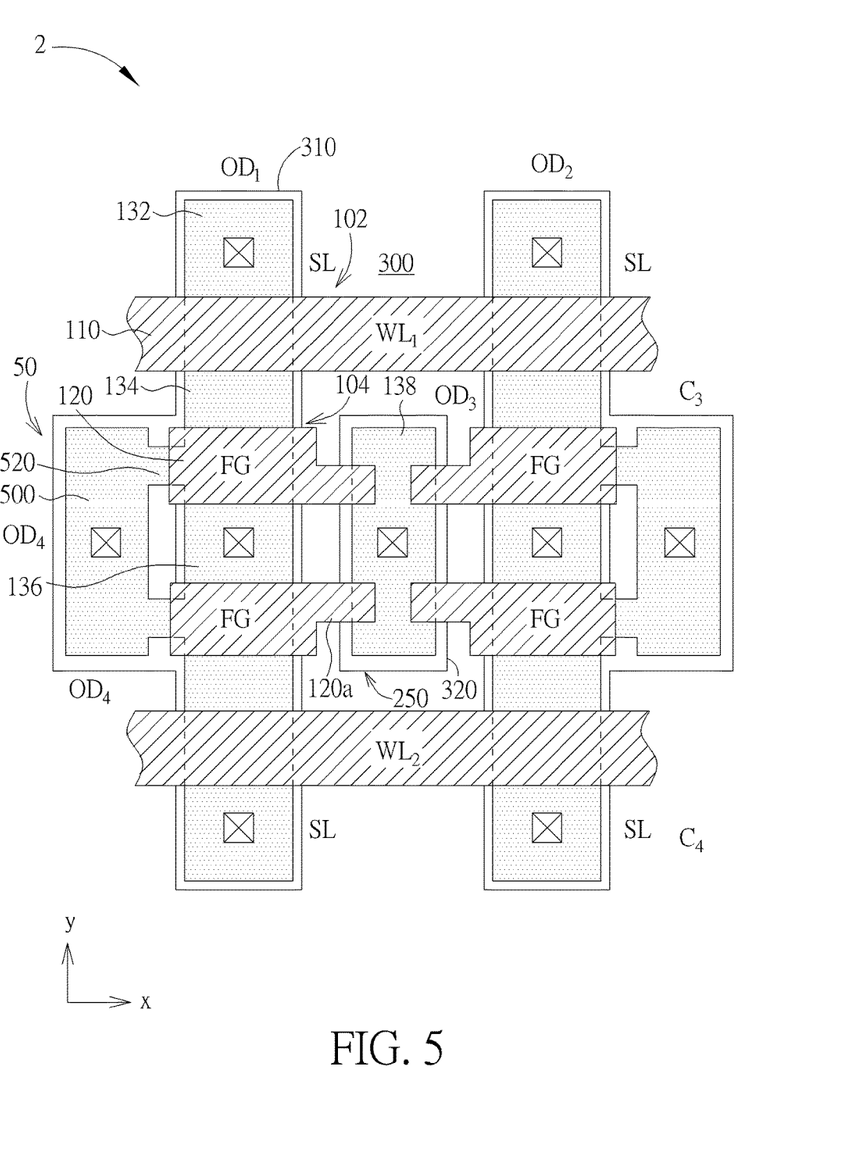
FIG. 5 to FIG. 7 show variants of the single-poly nonvolatile memory of FIG. 2 according to other embodiments of the invention.
Figure 6:
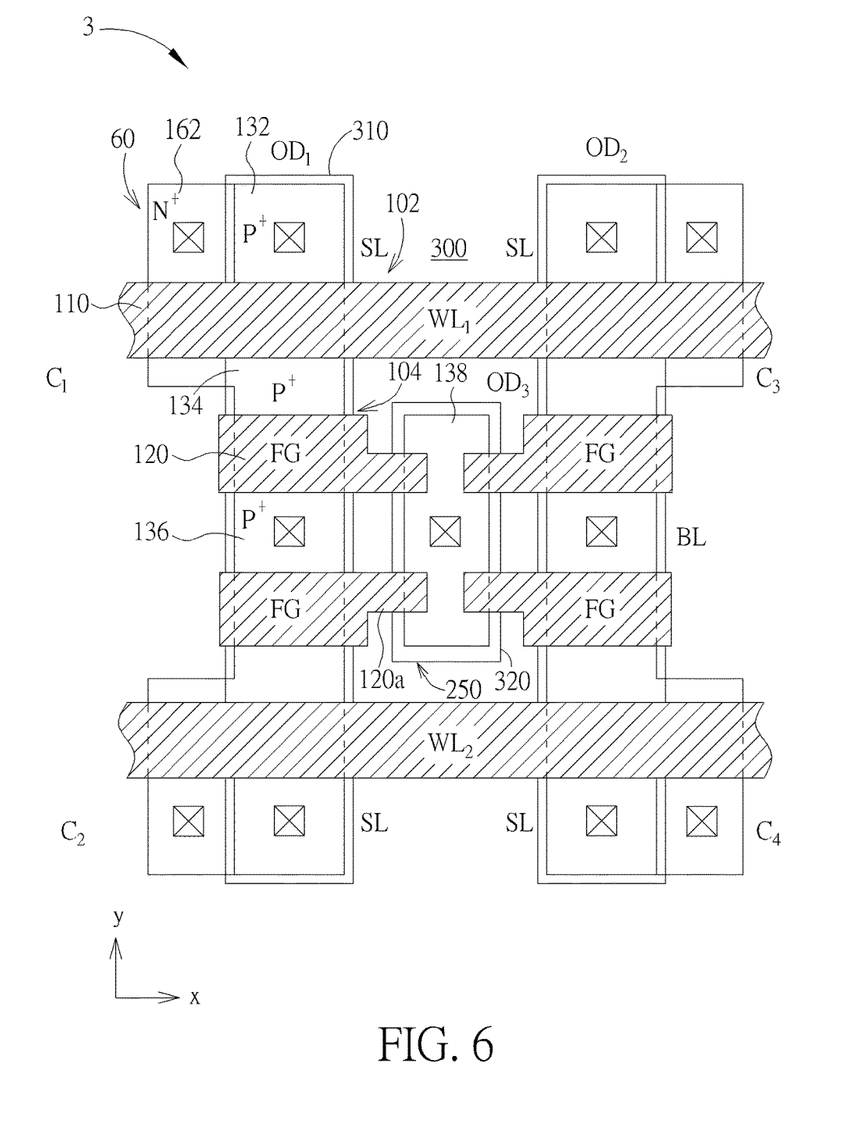
Figure 7:
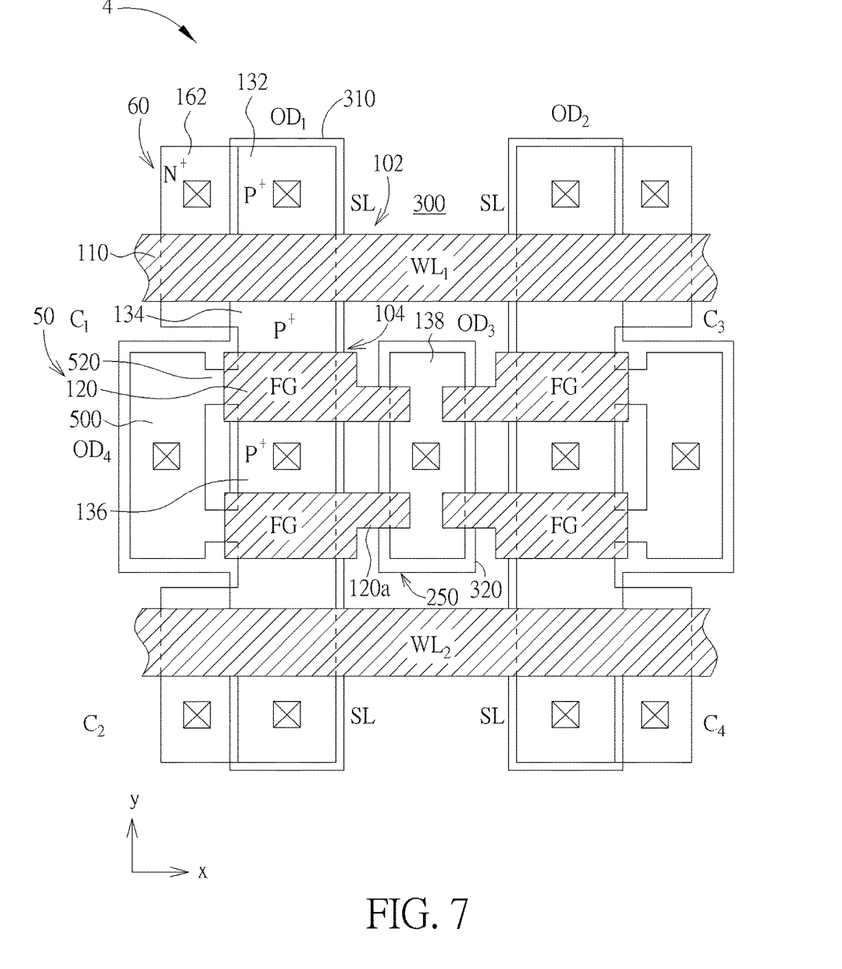

FIG. 5 to FIG. 7 show variants of the single-poly nonvolatile memory having an erase device according to other embodiments of the invention.

As shown in FIG. 5, the difference between the single-poly nonvolatile memory 2 depicted in FIG. 5 and the single-poly nonvolatile memory 1 depicted in FIG. 2 is that the single-poly nonvolatile memory 2 further comprises a charge collecting region 50 that is contiguous with the oxide define region $OD_1$. The charge collecting region 50 is able to collect redundant electrons and holes accumulated in the semiconductor layer 230 during operation of the single-poly nonvolatile memory cell.

According to the embodiment of the invention, the charge collecting region 50 comprises an oxide define region $OD_4$, an N+ doping region 500 in the oxide define region $OD_4$, a bridge region 520 connecting the N+ doping region 500 with the semiconductor layer 230 directly under the floating gate 120. The N well 310 may overlap with the oxide define region $OD_4$ and the bridge region 520. An N well (NW) contact may be provided on the N+ doping region 500 to electrically couple the charge collecting region 50 to an N well voltage $V_{NW}$. In FIG. 5, the two memory cells $C_1$ and $C_2$ share one charge collecting region and the two memory cells $C_3$ and $C_4$ share one charge collecting region.

As shown in FIG. 6, the difference between the single-poly nonvolatile memory 3 depicted in FIG. 6 and the single-poly nonvolatile memory 3 depicted in FIG. 6 is that the single-poly nonvolatile memory 3 further comprises an N+ doping region 162 that is contiguous with the P+ doping region 132 on the same side of the select gate 110, thereby forming a butted contact region 60. The N+ doping region 162 and the P+ doping region 132 are both electrically coupled to the source line voltage $V_{SL}$.

As shown in FIG. 7, the difference between the single-poly nonvolatile memory 4 depicted in FIG. 7 and the single-poly nonvolatile memory 1 depicted in FIG. 2 is that the single-poly nonvolatile memory 4 comprises charge collecting region 50 that is contiguous with the oxide define region $OD_1$. The charge collecting region 50 is able to collect redundant electrons and holes accumulated in the semiconductor layer 230 during operation of the memory. The charge collecting region 50 is described in FIG. 5. The single-poly nonvolatile memory 4 also comprises an N+ doping region 162 that is contiguous with the P+ doping region 132 on the same side of the select gate 110, thereby forming a butted contact region 60. The N+ doping region 162 and the P+ doping region 132 are both electrically coupled to the source line voltage $V_{SL}$.

Figure 8:
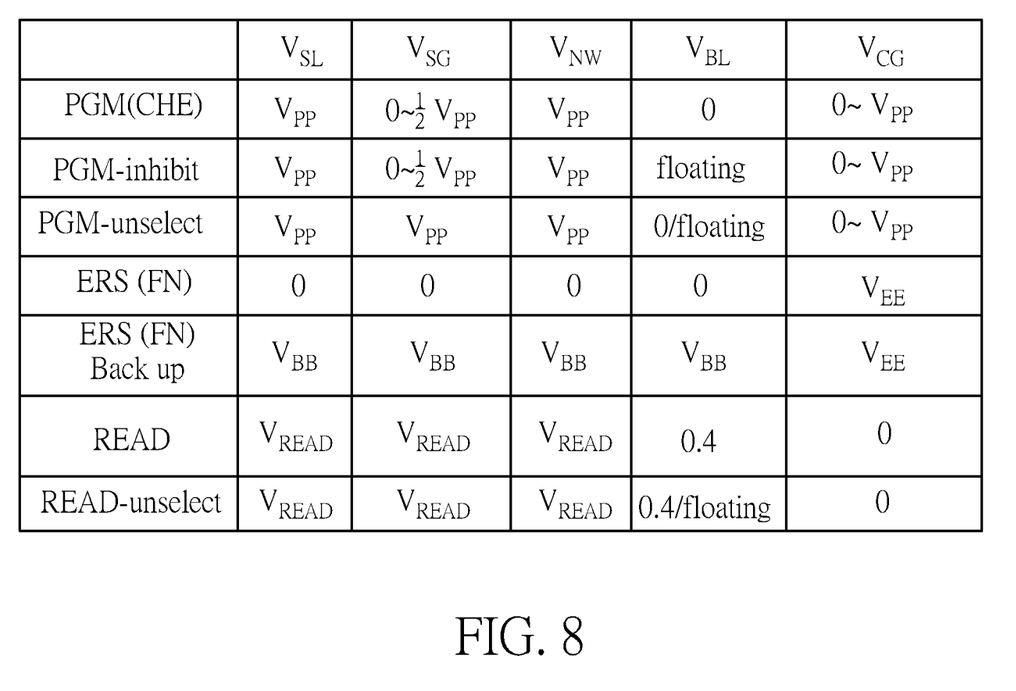
FIG. 8 illustrates an exemplary operation conditions for programming (PGM), reading (READ) or erasing (ERS) operations of the memory cell unit as set forth through FIG. 2 to FIG. 7.

FIG. 8 illustrates an exemplary operation conditions for programming (PGM), reading (READ) or erasing (ERS) operations of the memory cell unit as set forth through FIG. 2 to FIG. 7. As shown in FIG. 8, during programming (PGM) operation, the source line (SL) is coupled to a voltage source $V_{PP}$. For example, $V_{PP}$ may range between 5~9V. The bit line (BL) is grounded ($V_{BL}$=0V). The select gate (SG) 110 is provided with a voltage source between 0~½ $V_{PP}$. The erase line (EL) is provided with a voltage source between 0~$V_{PP}$. For the memory cells having the charge collecting region 50 as depicted in FIG. 5 and FIG. 7, the N+ doping region 500 is coupled to a voltage source $V_{PP}$. The voltage conditions for the memory cells under program-inhibit (PGM-inhibit) operation or under program-unselect (PGM-unselect) operation are also listed in FIG. 8.

During erasing (ERS) operation, the source line (SL) is grounded ($V_{SL}$=0V). The bit line (BL) is grounded ($V_{BL}$=0V). The select gate (SG) 110 is grounded ($V_{SG}$=0V). The erase line (EL) is provided with a voltage source $V_{EE}$. For example, $V_{EE}$ may range between 8~18V. For the memory cells having the charge collecting region 50 as depicted in FIG. 5 and FIG. 7, the N+ doping region 500 is grounded ($V_{NW}$=0V). Alternatively, the source line (SL) may be coupled to a voltage source $V_{BB}$. For example, $V_{BB}$ may range between −4~−8V. The bit line (BL) is coupled to the voltage source $V_{BB}$. The select gate (SG) 110 is coupled to the voltage source $V_{BB}$. The erase line (EL) is provided with $V_{EE}$. For example, $V_{EE}$ may range between 8~18V. For the memory cells having the charge collecting region 50 as depicted in FIG. 5 and FIG. 7, the N+ doping region 500 is coupled to the voltage source $V_{BB}$.

During READ operation, the source line (SL) is coupled to a voltage source $V_{READ}$ For example, $V_{READ}$ may range between 2~2.8V. The bit line (BL) may be coupled to 0.4V ($V_{BL}$=0.4V). The select gate (SG) 110 is grounded ($V_{SB}$=0V). The erase line (EL) is grounded ($V_{EL}$=0V). For the memory cells having the charge collecting region 50 as depicted in FIG. 5 and FIG. 7, the N+ doping region 500 is coupled to $V_{READ}$. The voltage conditions for the memory cells under read-unselect (READ-unselect) operation are also listed in FIG. 8.

Figure 9:
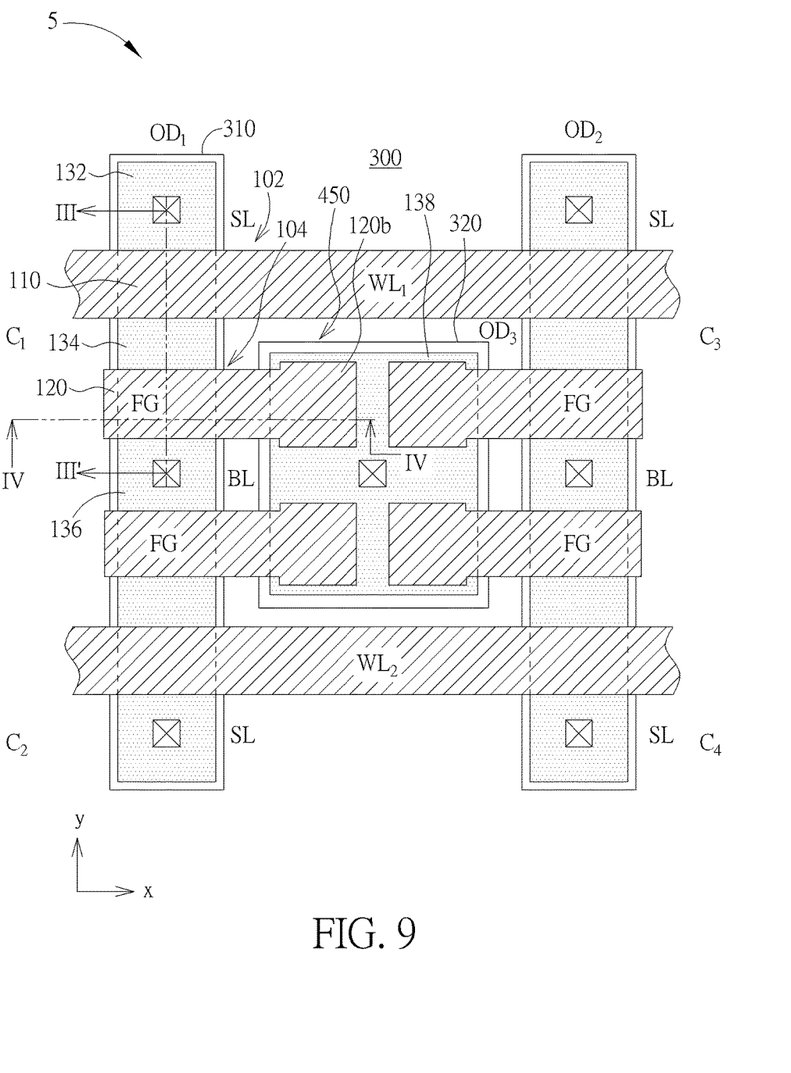
FIG. 9 is a schematic layout diagram showing a portion of a single-poly nonvolatile memory according to another embodiment of this invention.
Figure 10:
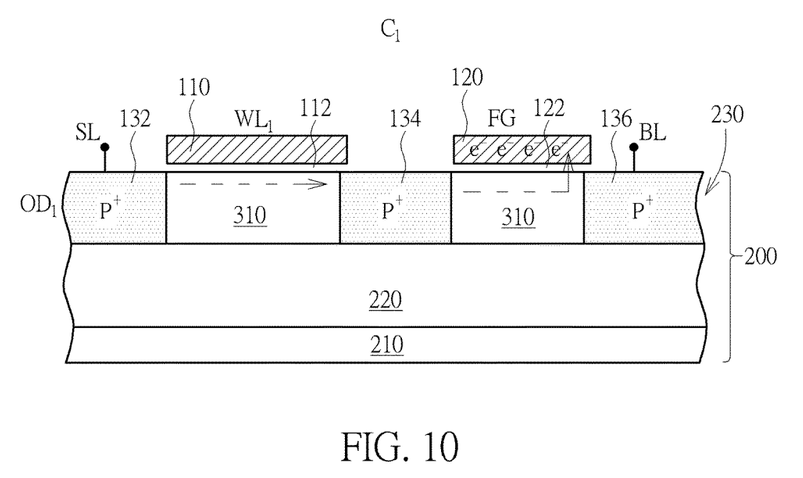
FIG. 10 is a cross-sectional view of a memory cell unit taken along line in FIG. 9.
Figure 11:
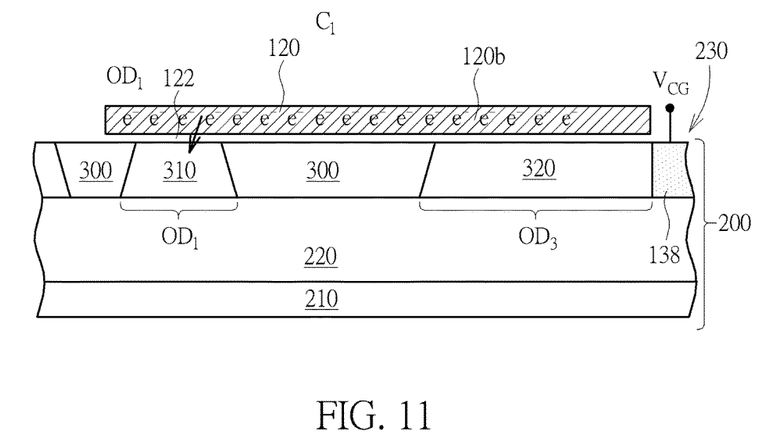
FIG. 11 is a cross-sectional view of a memory cell unit taken along line IV-IV' in FIG. 9.

Please refer to FIG. 9 and FIG. 11. FIG. 9 is a schematic layout diagram showing a portion of a single-poly nonvolatile memory according to another embodiment of this invention. FIG. 10 is a cross-sectional view of a memory cell unit taken along line III-III' in FIG. 9. FIG. 11 is a cross-sectional view of a memory cell unit taken along line IV-IV' in FIG. 9. As shown in FIG. 9, the single-poly nonvolatile memory 5 comprises a plurality of memory cells including, for example, four memory cell units $C_1$~$C_4$. It is understood that the layout of the memory cells in FIG. 9 is for illustration purposes only. In FIG. 9, for example, only three oxide define regions $OD_1$, $OD_2$, and $OD_3$ are shown. According to the embodiment of the invention, the memory cells $C_1$ and $C_2$ are fabricated on the oxide define region $OD_1$ and the memory cells $C_3$ and $C_4$ are fabricated on the oxide define region $OD_2$.

According to the embodiment of the invention, the oxide define regions $OD_1$ and $OD_2$ may be strip-shaped regions extending along a reference y-axis. The oxide define regions $OD_1$, $OD_2$, and $OD_3$ are isolated from one another by the shallow trench isolation (STI) region 300. Only two word lines $WL_1$ and $WL_2$ are shown in FIG. 9. The two word lines $WL_1$ and $WL_2$ intersect the oxide define regions $OD_1$, $OD_2$ and extend along a reference x-axis. An erase device 450 may be fabricated on the oxide define region $OD_3$. According to the embodiment of the invention, the erase device 450 maybe shared by the four memory cell units $C_1$~$C_4$.

According to the embodiment of the invention, the oxide define region $OD_3$ is interposed between the oxide define region $OD_1$ and the oxide define region $OD_2$. The oxide define region $OD_3$ is spaced apart from the two word lines $WL_1$ and $WL_2$. The oxide define region $OD_3$ does not overlap with the two word lines $WL_1$ and $WL_2$ when viewed from the above.

According to the embodiment of the invention, the memory cell unit $C_1$ and the memory cell unit $C_2$ share the same P+ drain/source doping region and the same bit line contact. According to the embodiment of the invention, the memory cell unit $C_3$ and the memory cell unit $C_4$ share the same P+ drain doping region and the same bit line contact.

As shown in FIG. 9, FIG. 10 and FIG. 11, each of the four memory cell units (taking the memory cell unit C1 as an example) comprises a PMOS select transistor 102 and a PMOS floating gate transistor 104 that is serially connected to the PMOS select transistor 102. The PMOS select transistor 102 and the PMOS floating gate transistor 104 are formed together on the oxide define region $OD_1$ that is defined in the semiconductor layer 230 of an SOI substrate 200. The cell structure of the memory cell units $C_2$ is mirror-symmetric to the memory cell unit $C_1$. The cell structures of the memory cell units $C_3$ and $C_4$ are mirror-symmetric to the memory cell units $C_1$ and $C_2$, respectively.

The semiconductor layer 230 may be a single-crystalline silicon layer, but is not limited thereto. The SOI substrate 200 may further comprise a buried oxide layer 220 and a silicon substrate 210. The semiconductor layer 230 is electrically isolated from the silicon substrate 210 by the buried oxide layer 220. The STI region 300 is contiguous with the buried oxide layer 230. The silicon substrate 210 may be a P type silicon substrate, but is not limited thereto. In the semiconductor layer 230, an N well 310, which is completely overlapped with the oxide define region $OD_1$, maybe formed by using ion implantation methods. In some embodiments, the N well 310 may be omitted so that the channel maybe formed in the intrinsic silicon.

The PMOS select transistor 102 comprises a select gate 110, a select gate oxide layer 122 between the select gate 110 and the semiconductor layer 230, a P+ source doping region 132, and a P+ drain/source doping region 134. The PMOS floating gate transistor 104 comprises a floating gate 120, a floating gate oxide layer 122 between the floating gate 120 and the semiconductor layer 230, the P+ drain/source doping region 134, and a P+ drain doping region 136. The PMOS select transistor 102 and the PMOS floating gate transistor 104 share the P+ drain/source doping region 134. For the sake of simplicity, spacers on the sidewalls of the select gate 110 and the floating gate 120 are not illustrated.

As can be seen in FIG. 9 and FIG. 11, the floating gate 120 includes an extended portion 120b that extends along the reference x direction to overlap with the oxide define region $OD_3$. The extended portion 120b may have a width that is greater than the width of the floating gate 120. According to the embodiment of the invention, the overlapping area between the extended portion 120b and the oxide define region $OD_3$ is greater than the overlapping area between the floating gate 120 and the oxide define region $OD_1$.

In the oxide define region $OD_3$, a heavily doped region 138 is formed. The heavily doped region 138 may be an N+ doping region or a P+ doping region. An ion well 320 such as an N well or a P well may be formed in the oxide define region $OD_3$. According to the embodiment, the heavily doped region 138 is an N+ doping region and the ion well 320 is an N well. According to another embodiment, the heavily doped region 138 is a P+ doping region and the ion well 320 is a P well. It is to be understood that the shape of the floating gate is only for illustration purposes.

According to the embodiment of the invention, the oxide define region $OD_3$, the heavily doped region 138, the floating gate oxide layer 122, and the extended portion 120b that is capacitively coupled to the heavily doped region 138 and the oxide define region $OD_3$ together constitute the erase device 450. The oxide define region $OD_3$ and the heavily doped region 138 may serve as a control gate.

In operation, the select gate 110 of the PMOS select transistor 102 is coupled to a select gate voltage $V_{SG}$, the P+ source doping region 132 of the PMOS select transistor 102 is electrically coupled to a source line voltage $V_{BL}$ by way of a source line (SL) contact, the P+ drain/source doping region 134 and the floating gate 120 are electrically floating, and the P+ drain doping region 136 of the PMOS floating gate transistor 104 is electrically coupled to a bit line voltage $V_{BL}$ through a bit line (BL) contact. The heavily doped region 138 is electrically coupled to a control gate voltage $V_{CG}$.

Under the program mode, electrons are selectively injected into the floating gate 120 by channel hot electron (CHE) injection. Under the erase mode (sector or chip erase), electrons may be erased from the floating gate 120 by Fowler-Nordheim (FN) tunneling.

Figure 12:
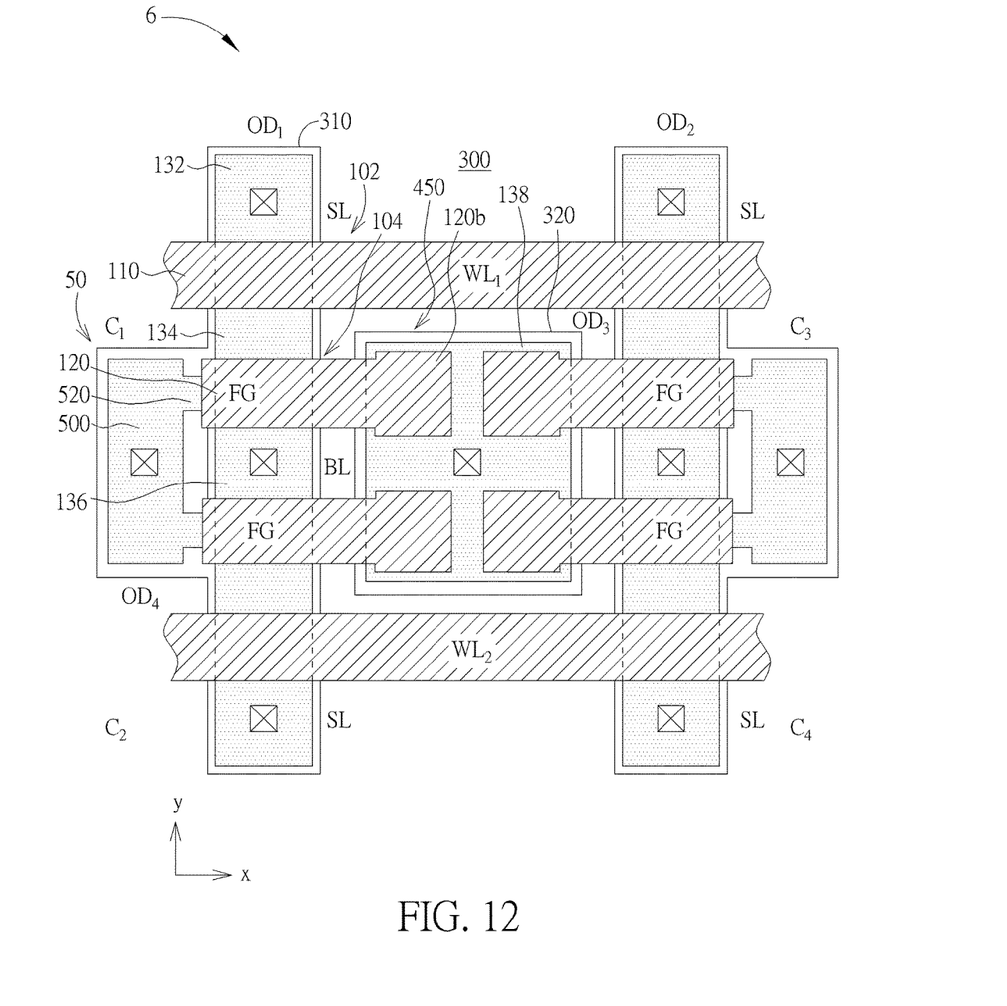
FIG. 12 shows a variant of the single-poly nonvolatile memory of FIG. 9 according to still another embodiment of the invention.

FIG. 12 shows a variant of the single-poly nonvolatile memory having an erase device according to still another embodiment of the invention.

As shown in FIG. 12, the difference between the single-poly nonvolatile memory 6 depicted in FIG. 12 and the single-poly nonvolatile memory 5 depicted in FIG. 9 is that the single-poly nonvolatile memory 6 further comprises a charge collecting region 50 that is contiguous with the oxide define region OD$_1$. The charge collecting region 50 is able to collect redundant electrons and holes accumulated in the semiconductor layer 230 during operation of the memory.

According to the embodiment of the invention, the charge collecting region 50 comprises an oxide define region OD$_4$, an N$^+$ doping region 500 in the oxide define region OD$_4$, a bridge region 520 connecting the N$^+$ doping region 500 with the semiconductor layer 230 directly under the floating gate 120. The N well 310 may overlap with the oxide define region OD$_4$ and the bridge region 520. An N well (NW) contact may be provided on the N$^+$ doping region 500 to electrically couple the charge collecting region 50 to an N well voltage V$_{NW}$. In FIG. 12, the two memory cells C$_1$ and C$_2$ share one charge collecting region and the two memory cells C$_3$ and C$_4$ share one charge collecting region.

Figure 13:
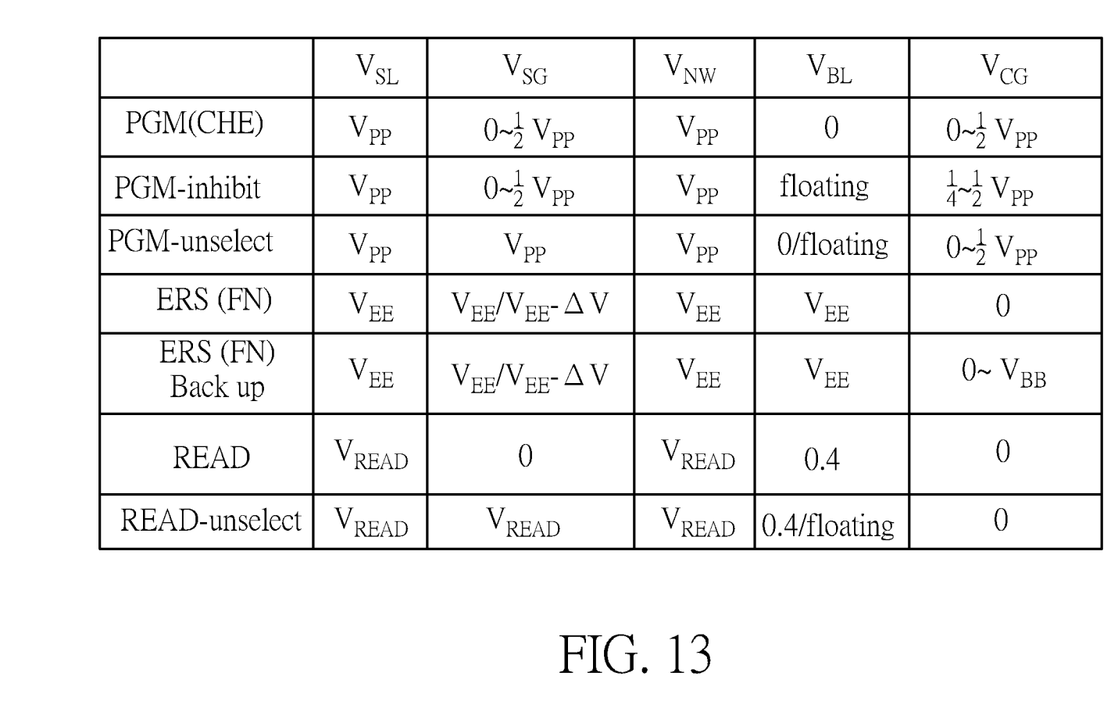
FIG. 13 illustrates an exemplary operation conditions for programming (PGM), reading (READ) or erasing (ERS) operations of the memory cell unit as set forth in FIG. 9 and FIG. 12.

FIG. 13 illustrates an exemplary operation conditions for programming (PGM), reading (READ) or erasing (ERS) operations of the memory cell unit as set forth in FIG. 9 and FIG. 12. As shown in FIG. 13, during programming (PGM) operation, the source line (SL) is coupled to a voltage source V$_{PP}$. For example, V$_{PP}$ may range between 5~9V. The bit line (BL) is grounded (V$_{BL}$=0V). The select gate (SG) 110 is provided with a voltage source between 0~½ V$_{PP}$. The control gate (CG) is provided with a voltage source between 0~½ V$_{PP}$. For the memory cells having the charge collecting region 50 as depicted in FIG. 12, the N$^+$ doping region 500 is coupled to a voltage source V$_{PP}$. The voltage conditions for the memory cells under program-inhibit (PGM-inhibit) operation or under program-unselect (PGM-unselect) operation are also listed in FIG. 13.

During erasing (ERS) operation, the source line (SL) is coupled to voltage source V$_{EE}$ (V$_{EE}$ may range between 8~18V). The bit line (BL) is coupled to voltage source V$_{EE}$. The select gate (SG) 110 is coupled to voltage source V$_{EE}$ or V$_{EE}$−ΔV (ΔV>Vt). The control gate (CG) is grounded (V$_{CG}$=0V). For example, V$_{EE}$ may range between 8~18V. For the memory cells having the charge collecting region 50 as depicted in FIG. 5 and FIG. 7, the N$^+$ doping region 500 is grounded (V$_{NW}$=0V). For the memory cells having the charge collecting region 50 as depicted in FIG. 12, the N$^+$ doping region 500 is grounded.

During READ operation, the source line (SL) is coupled to a voltage source V$_{READ}$ For example, V$_{READ}$ may range between 2~2.8V. The bit line (BL) may be coupled to 0.4V (V$_{BL}$=0.4V). The select gate (SG) 110 is grounded (V$_{SG}$=0V). The control gate (CG) is grounded (V$_{CG}$=0V). For the memory cells having the charge collecting region 50 as depicted in FIG. 12, the N$^+$ doping region 500 is coupled to V$_{READ}$. The voltage conditions for the memory cells under read-unselect (READ-unselect) operation are also listed in FIG. 13.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A single-poly nonvolatile memory cell, comprising:
   a silicon-on-insulator (SOI) substrate comprising a silicon substrate, a buried oxide layer, and a semiconductor layer;
   a first oxide define (OD) region and a second oxide define (OD) region on the semiconductor layer;
   an isolation region in the semiconductor layer, the isolation region separating the first OD region from the second OD region;
   a PMOS select transistor disposed on the first OD region;
   a PMOS floating gate transistor disposed on the first OD region, the PMOS floating gate transistor being serially connected to the PMOS select transistor, wherein the PMOS floating gate transistor comprises a floating gate overlying the first OD region;
   a floating gate extension continuously extended from the floating gate to the second OD region and being capacitively coupled to the second OD region, wherein an overlapping area between the floating gate extension and the second OD region is smaller than an overlapping area between the floating gate and the first OD region;
   a third oxide define (OD) region disposed on a side of the first OD region opposite to the second OD region;
   an N well in the semiconductor layer, wherein the N well completely overlaps with the first OD region and the third OD region; and
   a charge collecting region disposed in the third OD region and being contiguous with the first OD region, wherein the third OD region and the charge collecting region are situated within the N well.

2. The single-poly nonvolatile memory cell according to claim 1, wherein the PMOS select transistor comprises a select gate, a select gate oxide layer between the select gate and the semiconductor layer, a P$^+$ source doping region, and a P$^+$ drain/source doping region, wherein the P$^+$ source doping region is electrically connected to a source line.

3. The single-poly nonvolatile memory cell according to claim 2, wherein the PMOS floating gate transistor comprises a floating gate, a floating gate oxide layer between the floating gate and the semiconductor layer, a P$^+$ drain doping region and the P$^+$ drain/source doping region, wherein the P$^+$ drain/source doping region is shared by the PMOS select transistor and the PMOS floating gate transistor.

4. The single-poly nonvolatile memory cell according to claim 1 further comprising:
   an ion well in the semiconductor layer and completely overlapping with the second OD region; and
   a heavily doped region in the ion well within the second OD region.

5. The single-poly nonvolatile memory cell according to claim 4, wherein the ion well comprises N well or P well.

6. The single-poly nonvolatile memory cell according to claim 4, wherein the heavily doped region is an N$^+$ doping region.

7. The single-poly nonvolatile memory cell according to claim 4, wherein the heavily doped region is a P$^+$ doping region.

8. The single-poly nonvolatile memory cell according to claim 4, wherein the floating gate extension traverses the isolation region between the first OD region and the second OD region and partially overlaps with the second OD region to capacitively couple to the heavily doped region.

9. The single-poly nonvolatile memory cell according to claim 4, wherein the second OD region, the heavily doped region, the floating gate oxide layer, and the floating gate extension that is capacitively coupled to the heavily doped region together constitute an erase device.

10. The single-poly nonvolatile memory cell according to claim 4, wherein in operation, the select gate is coupled to a select gate voltage V$_{SG}$, the P$^+$ source doping region of the PMOS select transistor is electrically coupled to a source line voltage V$_{SL}$, the P$^+$ drain/source doping region and the floating gate are electrically floating, the P$^+$ drain doping region of the PMOS floating gate transistor is electrically coupled to a bit line voltage $V_{BL}$, and the heavily doped region is electrically coupled to an erase line voltage $V_{EL}$.

11. The single-poly nonvolatile memory cell according to claim 1, wherein the charge collecting region comprises an N+ doping region in the third OD region, a bridge region connecting the N+ doping region with the semiconductor layer directly under the floating gate.

12. The single-poly nonvolatile memory cell according to claim 11, wherein the N well overlaps with the third OD region and the bridge region.

13. The single-poly nonvolatile memory cell according to claim 1 further comprising:
   an N+ doping region that is contiguous with the P+ doping region on the same side of the select gate, thereby forming a butted contact region.

* * * * *